United States Patent [19]

Mend et al.

[11] 3,838,276

[45] Sept. 24, 1974

[54] PHOTOTRANSISTOR ARRAY HAVING REDUCED CROSSTALK

[75] Inventors: William G. Mend, Catonsville; Robert C. Treude, Severn, both of Md.

[73] Assignee: Westinghouse Electric Corporation, Pittsburgh, Pa.

[22] Filed: June 29, 1973

[21] Appl. No.: 375,208

[52] U.S. Cl............ 250/211 J, 250/209, 317/235 N

[51] Int. Cl............................................ H01l 15/00

[58] Field of Search.... 250/209, 208, 211 J, 220 M; 317/235 N; 340/166

[56] References Cited

UNITED STATES PATENTS

| | | | |
|---|---|---|---|
| 3,535,526 | 10/1970 | Henry et al. | 250/209 |
| 3,617,823 | 4/1971 | Hofstein | 317/235 N |
| 3,660,667 | 5/1972 | Weimer | 250/220 M X |

*Primary Examiner*—Walter Stolwein
*Attorney, Agent, or Firm*—J. B. Hinson

[57] ABSTRACT

A phototransistor array having an improved modulation transfer function (i.e., sensitivity) and reduced crosstalk over prior art devices of this type. This is accomplished by connecting one element of each transistor, usually the emitter, to metalizations which extend between base regions in rows of phototransistors in the array, the metalizations being connected to the emitter regions through stub sections which cover and block a minimal portion of the base regions which are exposed to light. This improves the modulation transfer function or sensitivity of the array. At the same time, since the metallizations extending along the rows of phototransistors cover and block light from the spaces between base regions, crosstalk is reduced.

4 Claims, 6 Drawing Figures

PHOTOTRANSISTOR ARRAY HAVING REDUCED CROSSTALK

BACKGROUND OF THE INVENTION

As is known, solid state television camera systems have been developed comprising a monolithic semiconductive wafer having a plurality of phototransistors formed therein. The phototransistors can be arranged in horizontally spaced columns along the X direction with the collectors in each column interconnected, and in vertically spaced rows along the Y direction with the emitters in each row interconnected. Scanning an image focused onto the mosaic in the horizontal direction can be achieved by sequentially connecting the emitters in the respective rows to ground; while scanning in the vertical direction, at a much lower frequency, can be achieved by sequentially connecting the collectors in the respective columns to a source of driving potential. A video signal is derived from a solid state camera of this type by means of a load resistor connected to the emitters or collectors of the phototransistors through field effect transistor switches.

Normally, collector columns are diffused into the monolithic semiconductive wafer, followed by a diffusion of discrete base regions. Finally, emitter regions are diffused into each base region; and these, appearing at the surface of the semiconductive wafer, are exposed to light.

In the past, it has been common to interconnect the emitters on the surface of the semiconductive wafer by means of metalizations which extend through the center of each base emitter combination. This arrangement, however, blocks a portion of the light from each base region and reduces the modulation transfer function or efficiency of each phototransistor, the metalization "notching out" the central region sensitivity. The modulation transfer function of each phototransistor is, of course, improved by concentrating as much of its sensitivity area at its locational center as possible. Additionally, due probably to the fact that the base diffusions spread, there is an overlap in the sensitivity profile of adjacent phototransistors; and since the area between phototransistors is exposed to incident radiation, a certain amount of crosstalk occurs, with the result that light impinging on one phototransistor will be reflected in the output signal from an adjacent phototransistor with an overall reduction in resolution.

SUMMARY OF THE INVENTION

In accordance with the present invention, a phototransistor array of the type described above is provided with a greatly improved modulation transfer function and with reduced crosstalk. This is achieved by providing metalizations for contacting the emitter rows which extend between base regions of successive phototransistors in the array, these metalizations being connected to the emitter regions through short stub portions. The stub portion minimizes the amount of light radiation which is blocked out on the base; and at the same time the metalizations which extend between base regions blank out the region of sensitivity overlap between adjacent phototransistors, resulting in reduced crosstalk.

Specifically, there is provided in accordance with the invention, a solid state electron optics device comprising a plurality of phototransistors on a common semiconductive substrate and onto which an optical image is focused. The transistors are formed by parallel columns in the substrate of one type conductivity which constitute one region (e.g., the collector) of each of the respective phototransistors. Discrete, spaced base regions of the other type conductivity are formed in the parallel columns; while regions of the said one type conductivity are formed in the base regions and constitute the remaining region (e.g., the emitter) of each phototransistor. Metalizations interconnect the last-named regions in rows which are essentially at right angles to the columns, each of the metalizations comprising a strip of electrically conductive material in the spaces between adjacent base regions and having stub portions which extend over the base regions and contact the emitter regions of the phototransistors exposed to light. In this manner, the desirable advantages of the invention described above are achieved.

The above and other objects and features of the invention will become apparent from the following detailed description taken in connection with the accompanying drawings, which form a part of this specification and in which.

Figure 1:
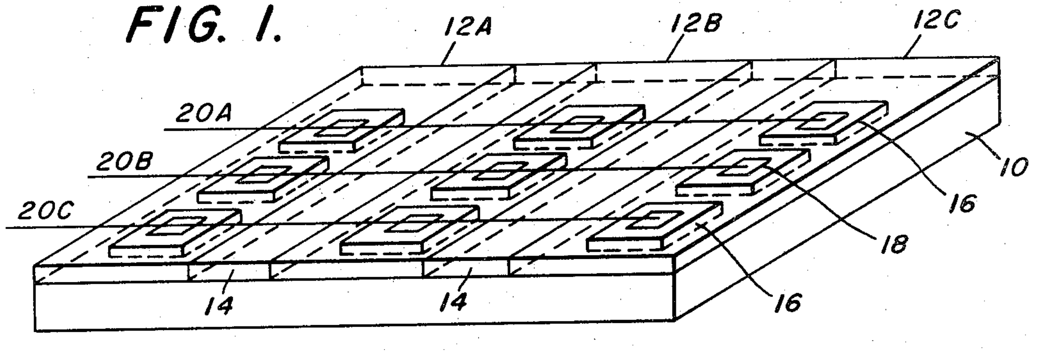
FIG. 1 is a perspective view of a mosaic of phototransistors of the type utilized in accordance with the present invention.

With reference now to the drawings, and particularly to FIG. 1, a section of a mosaic which can be used in accordance with the invention is shown. It comprises a wafer 10 of semiconductive material, such as silicon, having parallel P-type regions 12A, 12B and 12C diffused therein to form interconnected collector columns. Adjacent collector columns are completely insulated by diffused isolation areas 14. Spaced along each of the collector columns 12A, 12B and 12C are discrete base regions 16 which, in turn, have emitter regions 18 diffused therein, the base regions 16 being P-type and the emitter regions being N-type.

As will be understood, the configuration shown in FIG. 1 can be extended in both the X and Y direction up to any desired number, *n*. Metalized leads, not shown, can be connected to the collector columns 12A, 12B, 12C, and so on, such that successive ones of the collector columns can be connected to a source of driving potential through field effect transistors or the like. In this manner, vertical scanning of the mosaic is achieved. Similarly, the emitters 18 can be connected together in rows by vapor deposited metalized leads 20A, 20B, 20C and so on. The leads 20A–20C can be sequentially connected to ground through associated field effect transistor switches or the like. By focusing an image onto the surface of the assembly shown in FIG. 1, and by sequentially turning ON the individual photoconductive transistors, the entire image can be scanned in much the same manner as the electron beam of a conventional vidicon scans an image on a photosensitive surface. For example, the collector column 12A can be connected to a source of positive potential through a field effect transistor switch. Thereafter, by sequentially grounding leads 20A, 20B, 20C through associated switching transistors, the individual phototransistors are momentarily turned ON in sequence, whereby the current flowing through each phototransistor and appearing across a common load will be proportional to the light intensity of the image at a point covered by an individual phototransistor.

After one complete line has been scanned, the collector column 12A is disconnected from the source of driving potential and the collector column 12B is connected to the same source of potential, whereupon the leads 20A, 20B, 20C, and so on, are again sequentially grounded whereby the next line is scanned.

Figure 2A:
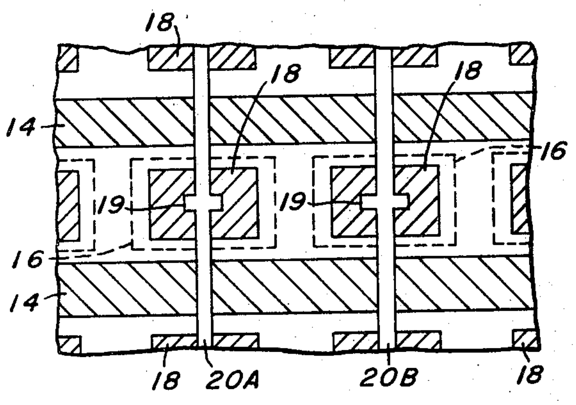
FIG. 2A. PRIOR ART
FIG. 2A illustrates the prior art method for interconnecting emitter rows in a phototransistor array.
Figure 2B:
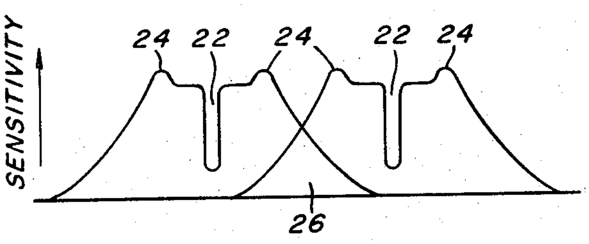
FIG. 2B is a plot illustrating the sensitivity profile of phototransistors having their emitters interconnected as shown in FIG. 2A.

Molecular mosaic sensors of the type described above have been formed with 400×500 mosaic patterns. As the density of the sensors has increased, so has the effect of crosstalk between adjacent elements on sensor performance. The prior art method for interconnecting emitter rows is shown in FIG. 2A wherein the metalizations 20A and 20B, for example, are deposited directly over the centers of the emitter regions 18 and have enlarged or spread portions 19. This results in a "notching out" of the center portion of the sensitivity profile as indicated by the reference numeral 22 in FIG. 2B. Sensitivity is greatest at the P-N junction between the base and emitter as indicated by regions 24. However, perhaps due to the spreading of the diffusions, the sensitivity profiles overlap as at 26, meaning that light focused onto the emitter of one phototransistor will be reflected in the output signal of an adjacent phototransistor.

Figure 3A:
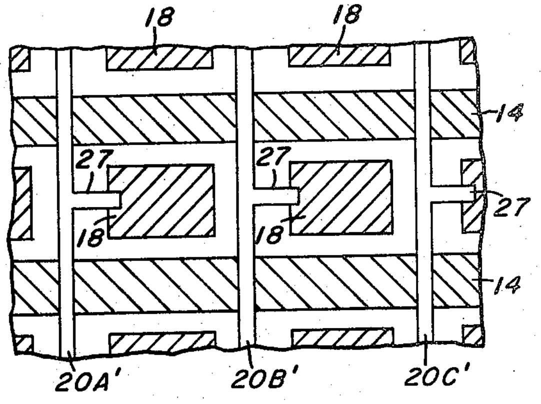
FIG. 3A illustrates the improved arrangement of the invention for interconnecting emitters in rows of phototransistors arranged in an array.

The system of the present invention is shown in FIG. 3A wherein the metalizations 20A', 20B' and 20C' extend between the base regions in rows of phototransistors and perpendicular to the common collector regions 12A, 12B, etc. Each metalization 20A'–20C' is connected to the emitters in its row through short stub sections 27 which overlap the edge of each emitter region.

Figure 3B:
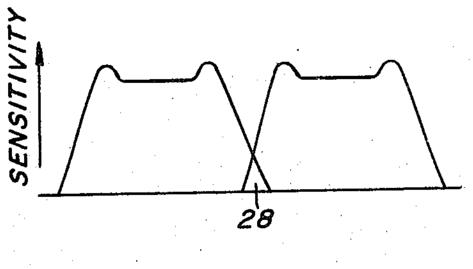
FIG. 3B is a graph illustrating the sensitivity profile of phototransistors interconnected as shown in FIG. 3A.

In this manner, the metalizations 20A'–20C' block out the light in the areas between adjacent base regions and at the same time do not notch-out any substantial portion of the central, main base regions. The sensitivity profile of the device of FIG. 3A is shown in FIG. 3B; and it will be appreciated that the sensitivity is materially increased and that the crosstalk at area 28 is also materially decreased over the case of FIG. 2B.

Figure 4:
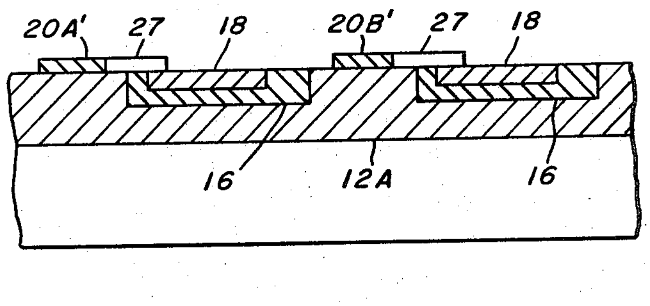
FIG. 4 is a cross-sectional view showing the location of the collector, base and emitter regions of the respective phototransistors in the array of FIG. 3A.

With reference to FIG. 4, it can be seen that the emitter regions 18 are moved to the left toward the metalizations 20A', 20B', etc. so as to minimize the length of the stub sections 27. Additionally, this sensitizes the central region of the emitter and suppresses the photon-conversion process in the region of crosstalk between base diffusions.

In an actual device constructed in accordance with the invention, sensitivity profiles of the active areas of a 20×20 element, 7.5 mil spaced mosaic were made using a 0.1 mil light spot. These revealed a uniformly sensitive central area and suppression of the crosstalk response between bases to only a few percent. The wider the metalization, the better the suppression of crosstalk.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. In a solid state electron optics device, the combination of a plurality of phototransistors on a common semiconductive substrate and onto which an optical image is focused, said transistors being formed by parallel columns in the substrate of one type conductivity which constitute one region of the respective phototransistors, said parallel columns being completely insulated from each other by isolation areas, discrete spaced base regions of the other type conductivity formed in said parallel columns, regions of said one type conductivity formed in said base regions and constituting the remaining region of each phototransistor, and metalizations interconnecting said last-named regions in rows which are at essentially right angles to said columns, each of said metalizations comprising a strip of metalized electrically conductive material in the spaces between adjacent base regions and having stub portions which extend over the base regions and contact said remaining regions.

2. The electron optics device of claim 1 wherein said one regions comprises the collector regions and said other regions comprises the emitter region.

3. The electron optics device of claim 2 wherein said emitter regions are offset with respect to said base regions so as to be closer to said stub portions.

4. The electron optics device of claim 1 wherein said stub portions contact said other regions only at the edges thereof.

* * * * *